US010629497B2

(12) United States Patent
Chung et al.

(10) Patent No.: US 10,629,497 B2
(45) Date of Patent: Apr. 21, 2020

(54) FINFET DEVICE STRUCTURE AND METHOD FOR ENLARGING GAP-FILL WINDOW

(71) Applicant: Taiwan Semiconductor Manufacturing Co., Ltd., Hsinchu (TW)

(72) Inventors: Han-Pin Chung, Kaohsiung (TW); Jian-Shiou Huang, Fangliao Township, Pingtung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/901,982

(22) Filed: Feb. 22, 2018

(65) Prior Publication Data

US 2019/0131186 A1    May 2, 2019

Related U.S. Application Data

(60) Provisional application No. 62/580,497, filed on Nov. 2, 2017.

(51) Int. Cl.
*H01L 21/8238* (2006.01)
*H01L 21/762* (2006.01)
(Continued)

(52) U.S. Cl.
CPC ........... *H01L 21/823878* (2013.01); *H01L 21/76224* (2013.01); *H01L 21/76229* (2013.01);
(Continued)

(58) Field of Classification Search
CPC ..... H01L 21/823431; H01L 21/823878; H01L 27/0924; H01L 29/16; H01L 29/1054; H01L 29/0649; H01L 21/76224; H01L 21/823807; H01L 21/823821; H01L 29/161
(Continued)

(56) References Cited

U.S. PATENT DOCUMENTS 8,796,666 B1   8/2014  Huang et al.
8,815,712 B2   8/2014  Wan et al.
(Continued)

*Primary Examiner* — Marcos D. Pizarro
*Assistant Examiner* — Sue Tang
(74) *Attorney, Agent, or Firm* — McClure, Qualey & Rodack, LLP (57) ABSTRACT

A semiconductor device structure and a method for forming the same are provided. The semiconductor device structure includes a first fin structure protruding from the first region of the semiconductor substrate and having a first portion and a second portion over the first portion. The semiconductor device structure also includes a liner structure including a first insulating liner layer and second insulating liner layer. The first insulating liner layer has a bottom portion covering the semiconductor substrate and a sidewall portion covering a sidewall of the first portion of the first fin structure. The second insulating liner layer is over the bottom portion and the sidewall portion of the first insulating liner layer and extends on a top surface of the sidewall portion of the first insulating liner layer. The semiconductor device structure also includes an isolation feature over the liner structure.

20 Claims, 7 Drawing Sheets

(51) Int. Cl.
  *H01L 29/161* (2006.01)
  *H01L 29/06* (2006.01)
  *H01L 29/10* (2006.01)
  *H01L 29/16* (2006.01)
  *H01L 27/092* (2006.01)

(52) U.S. Cl.
  CPC ............ *H01L 21/823807* (2013.01); *H01L 21/823821* (2013.01); *H01L 27/0924* (2013.01); *H01L 29/0649* (2013.01); *H01L 29/1054* (2013.01); *H01L 29/16* (2013.01); *H01L 29/161* (2013.01)

(58) Field of Classification Search
  USPC .......................................................... 257/369
  See application file for complete search history.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2016/0247876 A1* | 8/2016 | Chung ................ H01L 29/0649 |
| 2016/0293598 A1* | 10/2016 | Kim .................... H01L 27/0886 |
| 2017/0200810 A1* | 7/2017 | Mao .................. H01L 21/31053 |

* cited by examiner

FINFET DEVICE STRUCTURE AND METHOD FOR ENLARGING GAP-FILL WINDOW

CROSS REFERENCE TO RELATED APPLICATIONS

This application claims the benefit of U.S. Provisional Application No. 62/580,497 filed on Nov. 2, 2017, the entirety of which is incorporated by reference herein.

BACKGROUND

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFETs and methods of fabricating FinFETs have been generally adequate for their intended purposes, they have not been entirely satisfactory in all respects. For example, the fin structures are typically very high, and hence the aspect ratios of the gaps/trenches between the fin structures are also high. The gap filling capability is reduced due to an increase in the aspect ratio of those gaps/trenches, and hence voids may be formed in the shallow trench isolation (STI) structures.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Figure 1:
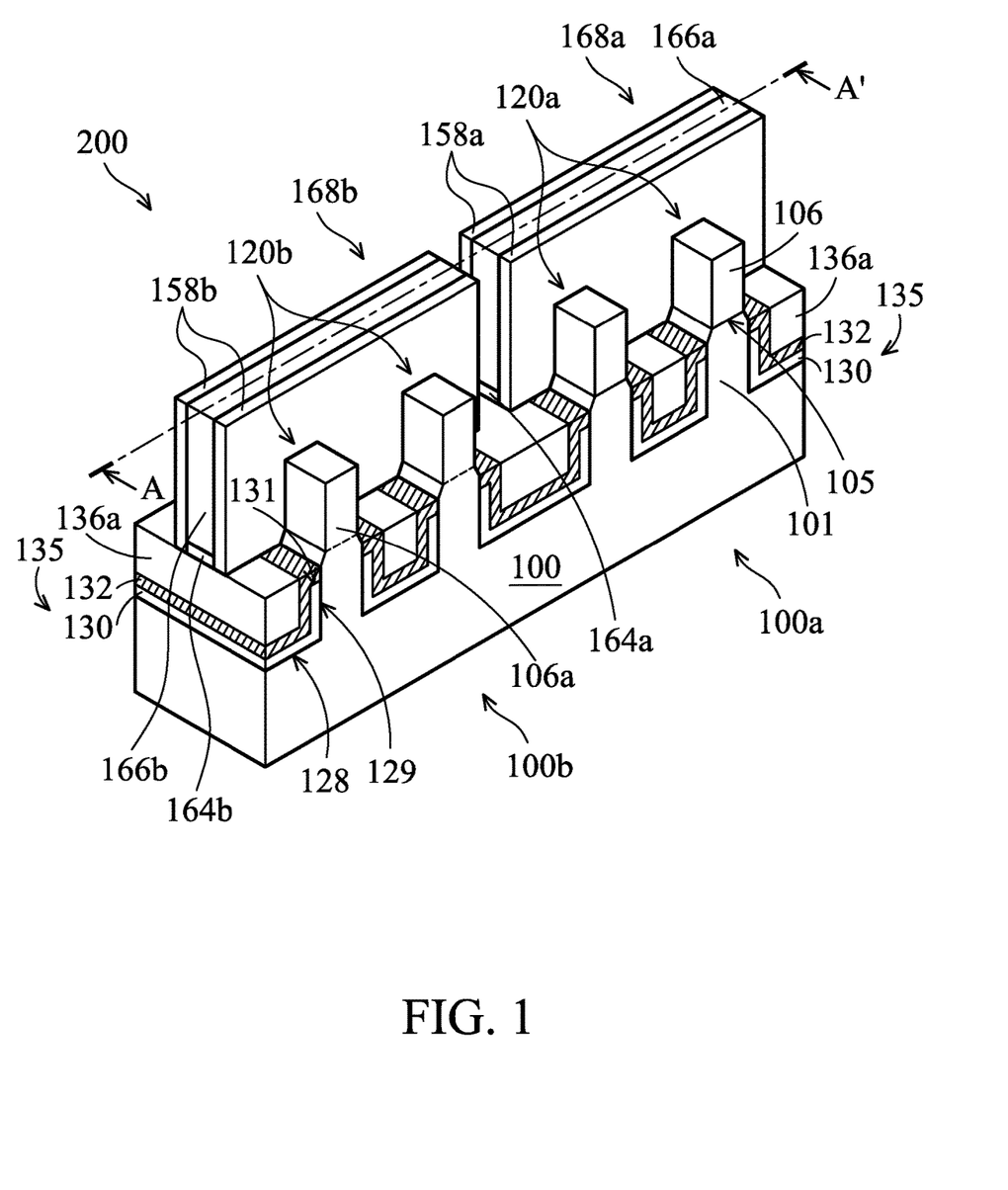
FIG. 1 is a perspective view of a semiconductor device structure with fin field-effect transistors (FinFETs) in accordance with some embodiments.

Embodiments of a semiconductor device structure and a method for forming the same are provided. FIG. 1 is a perspective view of a semiconductor device structure 200 including fin field-effect transistors (FinFETs) in accordance with some embodiments. In some embodiments, a gate-replacement process is employed to fabricate the semiconductor device structure 200.

As shown in FIG. 1, the semiconductor device structure 200 includes a semiconductor substrate 100 having a first region 100a (e.g. a PMOS region) for P-type FinFETs formed thereon and a second region 100b (e.g. an NMOS region) for N-type FinFETs formed thereon.

In some embodiments, one or more first fin structures 120a may be formed protruding from the first region 100a of the semiconductor substrate 100 and one or more second fin structures 120b may be formed protruding from the second region 100b of the semiconductor substrate 100. For example, the first fin structure 120a may include a first portion 101 and a second portion 106 over the first portion 101. The second fin structure 120b may have an upper portion 106a corresponding to the second portion 106 of the first fin structure 120a. The upper portion 106a of the second fin structure 120b and the second portion 106 of the first fin structure 120a may serve as channel regions of the FinFETs. Moreover, the first portion 101 may be formed of a material that is the same as the material of the semiconductor substrate 100 (e.g., silicon) and different from the material of the second portion 106 which may be formed of a semiconductor material (e.g., silicon germanium (SiGe) or the like). In those cases, the second fin structure 110b may be formed of a material that is the same as the material of the semiconductor substrate 100 (e.g., silicon).

In some embodiments, isolation structures may be positioned on opposing sides of the first portion 101 of the first fin structures 120a and opposing sides of the lower portion (below the upper portion 106a) of the second fin structures 120b. In some embodiments, each of the isolation structures includes an isolation feature 136a and a liner structure 135 covering the sidewall and the bottom of the isolation feature 136a, so that the semiconductor substrate 100, the first fin structures 120a, and the second fin structures 120b are spaced apart from the isolation features 136a by the liner structures 135.

In some embodiments, the liner structure 135 includes a first insulating liner layer 130 and a second insulating liner layer 132 over the first insulating liner layer 130. In the first region 100a, the first insulating liner layer 130 may have a bottom portion 128 covering the semiconductor substrate 100 and a sidewall portion 129 protruding from the bottom portion 128 and covering a sidewall of the first portion 101 of the first fin structure 120a. Similarly, in the second region 100b, the first insulating liner layer 130 may have a bottom portion 128 covering the semiconductor substrate 100 and a sidewall portion 129 protruding from the bottom portion 128 and covering a sidewall of the lower portion of the second fin structure 120b to expose the upper portion 106a (i.e., the channel region) of the second fin structure 120b. The second insulating liner layer 132 may be formed over the bottom portion 128 and the sidewall portion 129 of the corresponding first insulating liner layer 130 and extending on a top surface 131 of the sidewall portion 129 of the corresponding first insulating liner layer 130, so that the second insulating liner layer 132 is between the corresponding first insulating liner layer 130 and the corresponding isolation feature 136a.

In some embodiments, the first insulating liner layer 130 is formed of silicon oxide ($SiO_2$) and the second insulating liner layer 132 may be formed of a material different from the material of the first insulating liner layer 130. For example, the second insulating liner layer 132 may be formed of a nitride-containing film (e.g., a silicon nitride (SiN or $Si_3N_4$) film or an oxynitride-containing film (e.g., a silicon oxynitride (SiON) film).

In some embodiments, a gate structure 168a and a gate structure 168b are respectively positioned over the first fin structures 120a in the first region 100a of the semiconductor substrate 100 and over the second fin structures 120b in the second region 100b of the semiconductor substrate 100. For example, the gate structure 168a may include a dummy gate dielectric layer 164a, a dummy gate electrode layer 166a, and gate spacers 158a. The dummy gate electrode layer 166a is positioned over the dummy gate dielectric layer 164a. The gate spacers 158a are formed on opposite sidewalls of the dummy gate electrode layer 166a and over the first fin structures 120a. The gate structure 168b may include a dummy gate dielectric layer 164b, a dummy gate electrode layer 166b, and gate spacers 158b. The dummy gate electrode layer 166b is positioned over the dummy gate dielectric layer 164b. The gate spacers 158b are formed on opposite sidewalls of the dummy gate electrode layer 166b and over the second fin structures 120b. In addition, source/drain features (not shown) may be formed on outer sidewalls of the gate spacers 158a and 158b.

Figure 2:
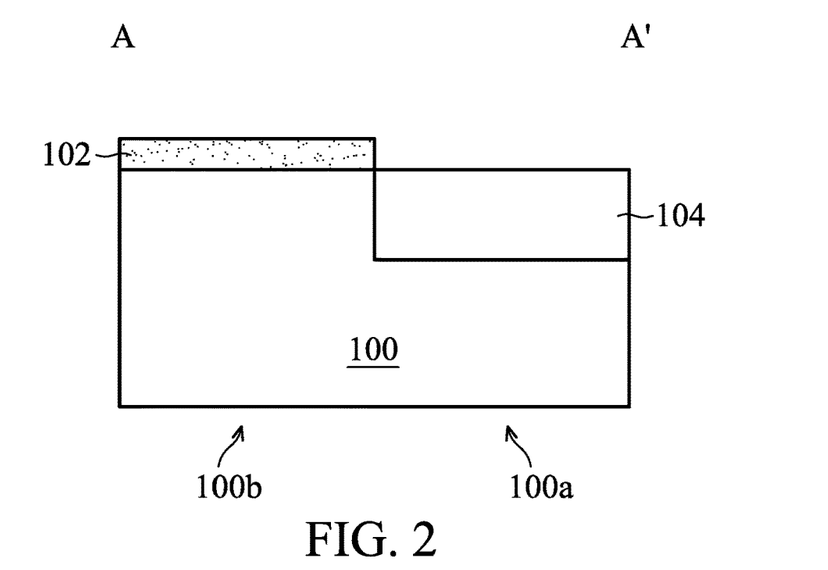
FIG. 2, FIG. 3, FIG. 4, FIG. 5, FIG. 6, FIG. 7, FIG. 8, FIG. 9, FIG. 10, FIG. 11, FIG. 12, and FIG. 13 are cross-sectional views showing various stages of a method of forming a semiconductor device structure with FinFETs in accordance with some embodiments.

FIG. 2, FIG. 3, FIG. 4, FIG. 5, FIG. 6, FIG. 7, FIG. 8, FIG. 9, FIG. 10, FIG. 11, FIG. 12, and FIG. 13 are cross-sectional views along line A-A' of FIG. 1 to show various stages of a process for forming the semiconductor device structure 200, in accordance with some embodiments. As shown in FIG. 2, a semiconductor substrate 100 is provided. The semiconductor substrate 100 may be made of silicon or other semiconductor materials. In some embodiments, the semiconductor substrate 100 may be a bulk semiconductor, a semiconductor-on-insulator (SOI) substrate, or the like, which may be doped (e.g. with a P-type or an N-type dopant) or undoped. The semiconductor substrate 100 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the semiconductor substrate 100 may include silicon.

In some embodiments, the semiconductor substrate 100 has a first region 100a and a second region 100b adjacent to the first region 100a. In an example, the first region 100a may be employed to form P-type devices, such as P-type metal-oxide-semiconductor field-effect transistors (MOSFETs), and the second region 100b may be employed to form N-type devices, such as N-type MOSFETs, and hence the first region 100a is referred to as a PMOS region, and the second region 100b is referred to as an NMOS region. In some other embodiments, P-type devices (or N-type devices) are formed in both the first region 100a and the second region 100b.

In some embodiments, a first well region (not shown), such as an N-Well region, is formed in the first region 100a of the semiconductor substrate 100 and a second well region (not shown), such as a P-Well region, is formed in the second region 100b of the semiconductor substrate 100. The N-Well region and the P-Well region may be formed byion implantation processes. In some embodiments, the first well region is doped with arsenic (As) or phosphorous (P) ions to form the N-well region, and the second well portion 106 may be doped with boron (B) ions to form the P-well region.

Afterwards, a portion of the semiconductor substrate 100 including silicon in the first region 100a is removed by an etching process (such as a wet etching process or a dry etching process) using a masking layer 102 over the second region 100b as an etch mask, in accordance with some embodiments. For example, the masking layer 102 may be a photoresist or a suitable masking material, may be formed over the semiconductor substrate 100 using a photolithography process or a deposition process (e.g., a chemical vapor deposition (CVD), physical vapor deposition (PVD), or spin coating process). The semiconductor substrate 100 in the first region 100a and exposed from the masking layer 102 is removed by a suitable dry etching process, such as reactive ion etch (RIE), neutral beam etch (NBE), the like, or a combination thereof, to form a recess (not shown) in the first region 100a.

Figure 3:
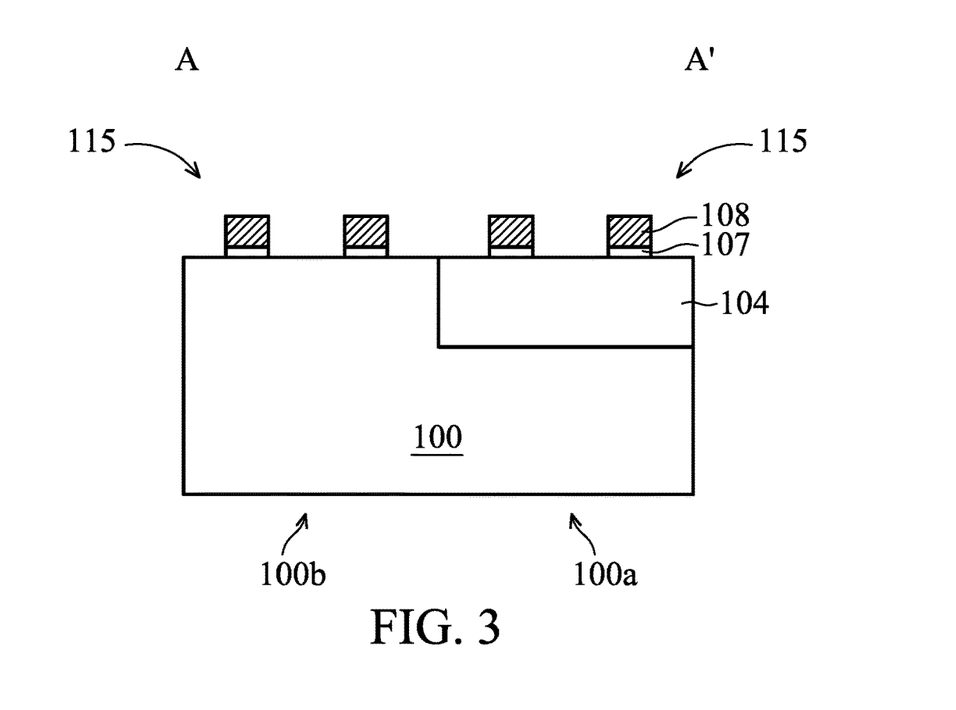

A semiconductor material 104 (e.g., silicon germanium (SiGe) or the like) is epitaxially grown in the recess in the first region 100a by an epitaxial growth process, as shown in FIG. 2 in accordance with some embodiments. After forming the semiconductor material 104, the masking layer 102 may be removed by a suitable removal process, such as etching or plasma ashing, as shown in FIG. 3 in accordance with some embodiments. Afterwards, a planarization process, such as chemical mechanical polish (CMP), may be performed, so that the top surface of the semiconductor material 104 is substantially level with the top surface of the semiconductor substrate 100. The semiconductor material 104 in the first region 100a and a portion of the semiconductor substrate 100 (e.g., silicon (Si) material) in the second region 100b are employed to define a channel region below a gate structure. The silicon germanium (SiGe) having a compressive strain is suitable for providing increased carrier speed, i.e., increased hole carrier speed, for the channel region of P-type FinFET (i.e., PMOS device). The strained silicon (Si) material having intrinsic tensile strain is suitable for the channel region of N-type FinFET (i.e., NMOS device).

Figure 4:
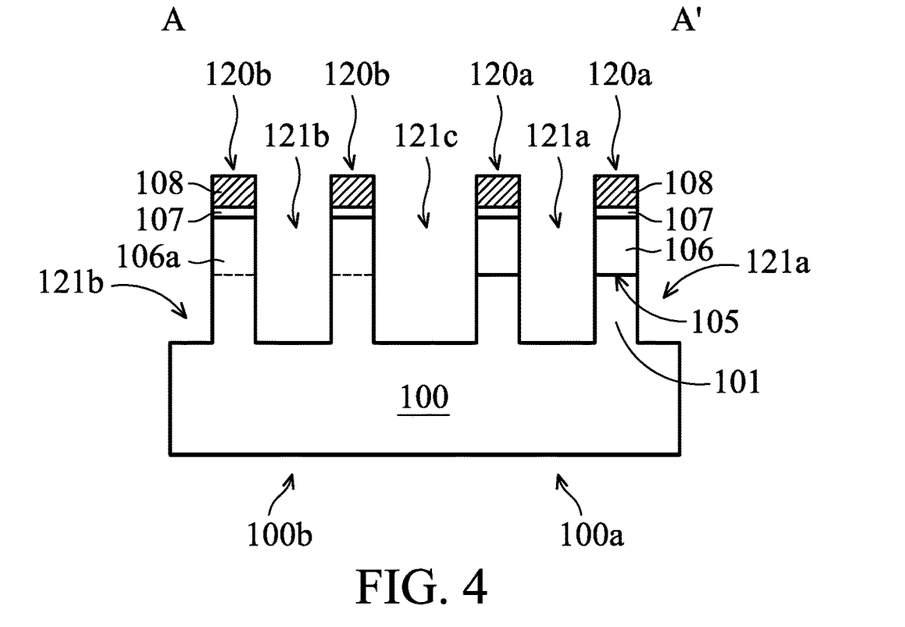

Afterwards, one or more first fin structures 120a are formed in the first region 100a of the semiconductor substrate 100 and one or more second fin structures 110b are formed in the second region 100b of the semiconductor substrate 100 by a patterning process, as shown in FIGS. 3 and 4 in accordance with some embodiments. As shown in FIG. 3, in some embodiments, a masking structure including a single layer or a multi-layer structure is provided over the semiconductor material 104 in the first region 110a and the semiconductor substrate 100 in the second region 110b. For example, the masking structure includes a silicon oxide layer 107 and an overlying silicon nitride layer 108 and is formed over the semiconductor material 104 in the first region 110a and the semiconductor substrate 100 in the second region 110b by deposition processes. Such deposition processes may include a chemical vapor deposition (CVD) process, a high-density plasma chemical vapor deposition (HDPCVD) process, a spin-on process, a sputtering process, or another applicable process. In some embodiments, the silicon oxide layer 107 is formed by a thermal oxidation process and the silicon nitride layer 108 is formed by a low-pressure chemical vapor deposition (LPCVD) process or a plasma enhanced chemical vapor deposition (PECVD) process, for example.

Afterwards, the masking structure including the silicon oxide layer 107 and the silicon nitride layer 108 are patterned by a patterning process to form a patterned masking structure 115 for definition of fin structures, as shown in FIG. 3, in accordance with some embodiments. Such a patterning process may include a photolithography process followed by an etching process (such as a dry etching process or a wet etching process).

An etching process (such as a dry or wet etching process) is performed on the semiconductor material 104 in the first region 110a and the semiconductor substrate 100 in the second region 110b using the patterned masking structure 115 as an etch mask, so as to form first fin structures 120a, second fin structures 120b, and trenches 121a, 121b, and 121c, as shown in FIG. 4 in accordance with some embodiments. In those cases, the trench 121a is formed in the semiconductor material 104 (as indicated in FIG. 3) and the underlying semiconductor substrate 100 in the first region 100a. The trench 121b is formed in the semiconductor substrate 100 in the second region 100b. The trench 121c is formed in the semiconductor material 104 and the underlying semiconductor substrate 100 in the first region 100a and in the semiconductor substrate 100 in the second region 100b. The trench 121c is formed between the first fin structure 120a and the second fin structure 110b.

In some embodiments, each first fin structure 120a may include a first portion 101 and a second portion 106 over the first portion 101. The first portion 101 may be formed of a material that is the same as that of the semiconductor substrate 100 (e.g. silicon) and different from that of the second portion 106 which may be formed of a semiconductor material (e.g., silicon germanium (SiGe)). Each second fin structure 110b may be formed of a material that is the same as the material of the semiconductor substrate 100 (e.g. silicon).

It should be noted that the number of first fin structures 120a and the number of second fin structures 120b may be adjusted according to actual application, and it is not limited to the embodiment shown in FIG. 4.

Figure 5:
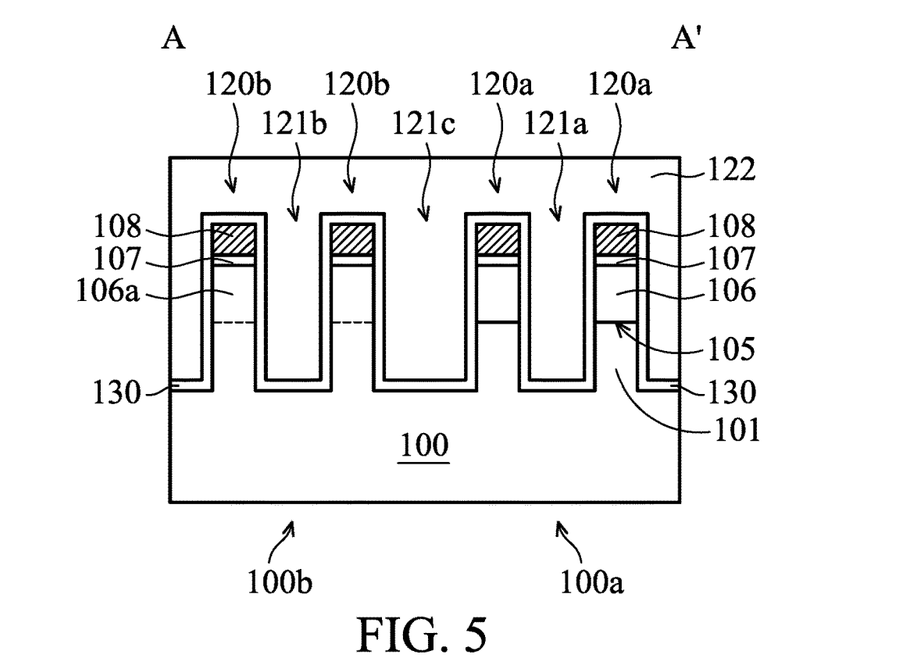

As shown in FIGS. 5, 6, 7, and 8, a liner structure 135 is conformally formed over the semiconductor substrate 100, the first fin structures 120a and the second fin structures 120b, in accordance with some embodiments. The liner structure 135 may serve as a shallow trench isolation (STI) liner and a protective layer for the fin structures. As shown in FIG. 5, a first insulating liner layer 130 is conformally formed to cover the semiconductor substrate 100, the first fin structures 120a, the second fin structures 120b, and the patterned masking structure (which includes the silicon oxide layer 107 and the silicon nitride layer 108).

More specifically, the first insulating liner layer 130 is conformally formed over the sidewalls of the patterned masking structure, the first fin structures 120a, and the second fin structures 120b, and over the top surface of the patterned masking structure. In some embodiments, the first insulating liner layer 130 is a silicon oxide ($SiO_2$) film. The first insulating liner layer 130 may be formed by a thermal oxidation process or a deposition process including CVD, PVD, ALD, the like, or a combination thereof.

After the first insulating liner layer 130 is formed, a masking layer 122 is formed over the first insulating liner layer 130 above the patterned masking structure and fills the trenches 121a, 121b, and 121c, in accordance with some embodiments. In some embodiments, the masking layer 122 may be a polymer layer, such as a bottom anti-reflection coating (BARC) layer, and may be formed by spin-on coating technology.

Figure 6:
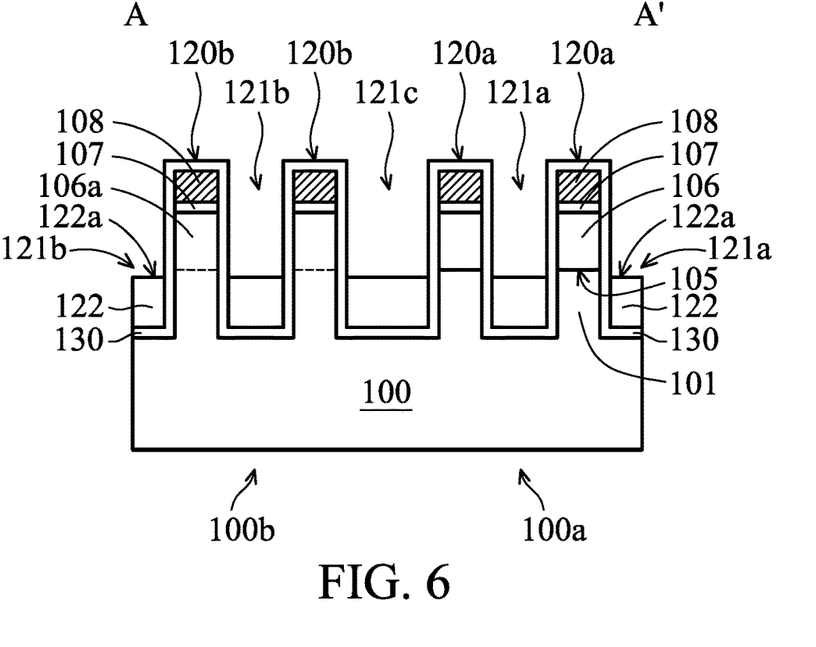

As shown in FIG. 6, the masking layer 122 is recessed by an etching process, to expose a portion of the masking layer 122, in accordance with some embodiments. For example, the masking layer 122 is etched backed by a dry etching process or a wet etching process, so that the masking layer 122 has a top surface 122a below an interface 105 between the first portion 101 and the second portions 106 of each first fin structure 120a.

Figure 7:
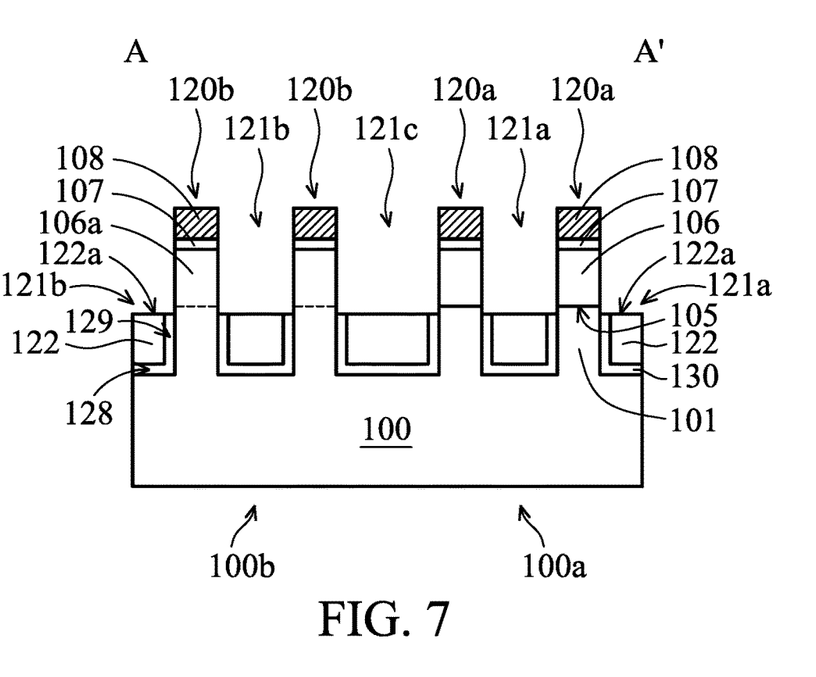

As shown in FIG. 7, after the masking layer 122 is etched backed, the first insulating liner layer 130 is etched using the etched masking layer 122 as an etch mask in accordance with some embodiments, so as to leave a portion of the first insulating liner layer 130 below the interface 105 between the first portion 101 and the second portions 106 of each first fin structure 120a and below the bottom (as indicated by a dashed line shown in FIG. 7) of the upper portion 106a of the second fin structure 120b.

In some embodiments, the first insulating liner layer 130 exposed from the top surface 122a of the etched masking layer 122 is removed by a dry etching process or a wet etching process. The remaining first insulating liner layer 130 in each of trenches 121a, 121b, and 121c has a bottom portion 128 covering the semiconductor substrate 100 and a sidewall portion 129 covering sidewalls of the first portion 101 of the first fin structure 120a and the lower portion of the second fin structure 120b.

Figure 8:
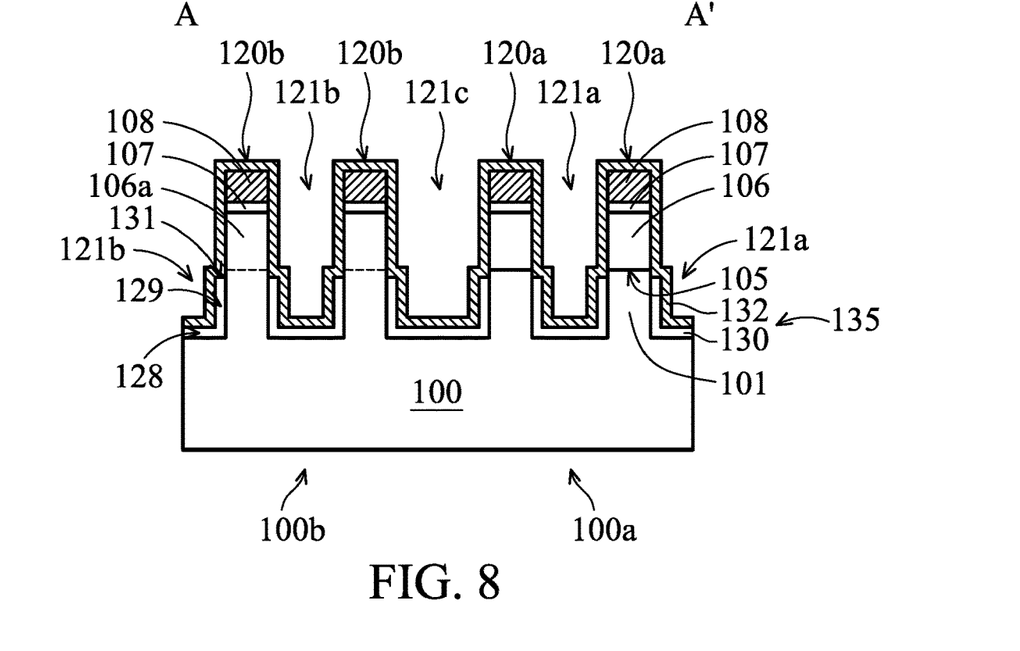

As shown in FIG. 8, the masking layer 122 is removed to expose the remaining first insulating liner layer 130 in each of trenches 121a, 121b, and 121c in accordance with some embodiments. Afterwards, a second insulating liner layer is conformally formed to cover the remaining first insulating liner layer 130, the second portion 106 of each first fin structure 120a, and the upper portion of each second fin structure 120b after the masking layer 122 is removed, in accordance with some embodiments. More specifically, the second insulating liner layer 132 may be formed over the bottom portion 128 and the sidewall portion 129 of the corresponding remaining first insulating liner layer 130 and extend on a top surface 131 of the sidewall portion 129 of the corresponding remaining first insulating liner layer 130.

In some embodiments, the second insulating liner layer 132 may be formed of a material that is different from a material of the first insulating liner layer 130. For example, the second insulating liner layer 132 may be a nitride-containing film (e.g., a silicon nitride (SiN or $Si_3N_4$) film) or an oxynitride-containing film (e.g., a silicon oxynitride (SiON) film). In some embodiments, the second insulating liner layer 132 is formed by a deposition process including CVD, PVD, ALD, the like, or a combination thereof.

The first insulating liner layer 130 of the liner structure 135 includes silicon oxide and hence may block or reduce charges trapped in the second insulating liner layer 132 (which includes silicon nitride or oxynitride) into the first fin structures 120a and the second fin structures 120b.

Moreover, the second portion 106 of the first fin structure 120a that is formed of silicon germanium (SiGe) is easily oxidized to form germanium oxide ($GeO_x$). The germanium oxide (GeOx) is easily removed by the etching process. Therefore, the profiles or shape of the first fin structures 110a will be changed. The second insulating liner layer 132 including silicon nitride or oxynitride may prevent the second portion 106 of the first fin structures 120a from being damaged (e.g., oxidized) due to the subsequent high temperature process (e.g., the wet steam anneal process for shallow trench isolation (STI) which is sometimes referred to as STI steam anneal process).

Figure 9:
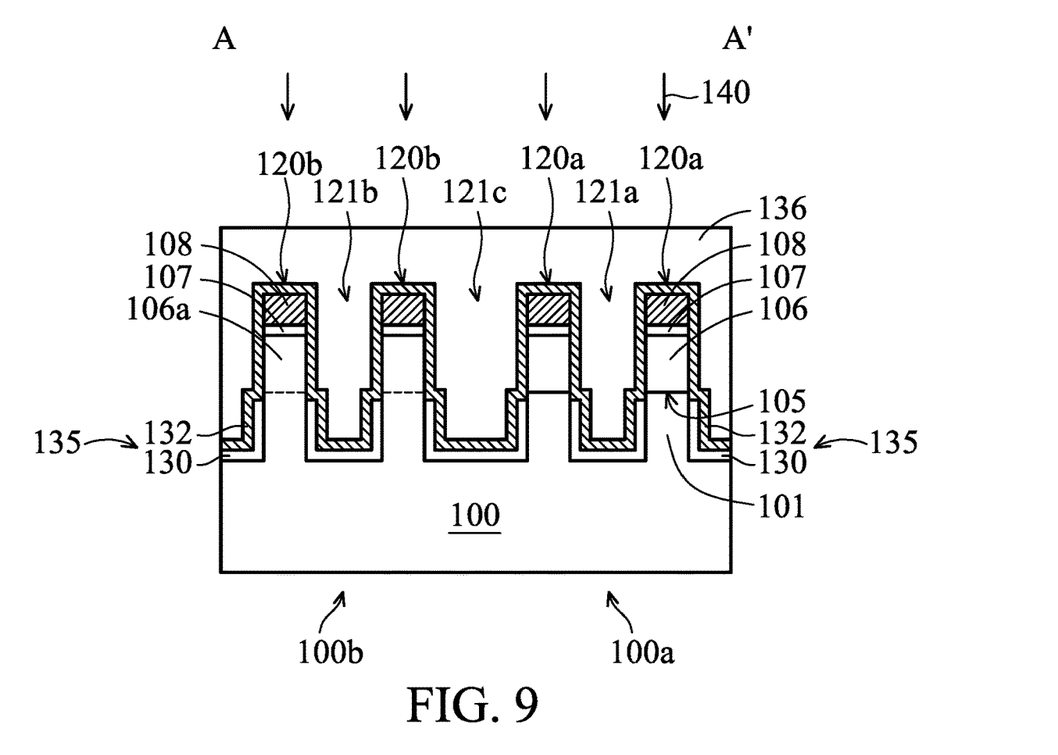

As shown in FIG. 9, after the liner structure 135 is formed, an insulating layer 136 is formed over the first and second fin structures 120a and 120b that are covered by the liner structure 135, in accordance with some embodiments. The insulating layer 136 also fills the trenches 121a, 121b, and 121c. In some embodiments, the insulating layer 136 may be formed of silicon oxide, silicon nitride, low-k dielectric materials, or a combination thereof, and may be formed by a flowable CVD (FCVD) process. Other insulating materials and/or other formation processes may be used.

After the insulating layer 136 is formed, an anneal process 140 is performed to cure the insulating layer 136, in accordance with some embodiments. The anneal process 140 may include a wet steam anneal process. In some embodiments, the wet steam anneal process (e.g., a thermal anneal process performed in an environment including oxidant gas contained steam) is performed at a high temperature such as not less than 150° C.

In some embodiments, since the second insulating liner layer 132 of the liner structure 135 includes nitride or oxynitride which blocks oxygen that comes from the wet steam used during the anneal process 140, the material of the first and/or second fin structures 110a and/or 110b can be protected from being oxidized.

Figure 10:
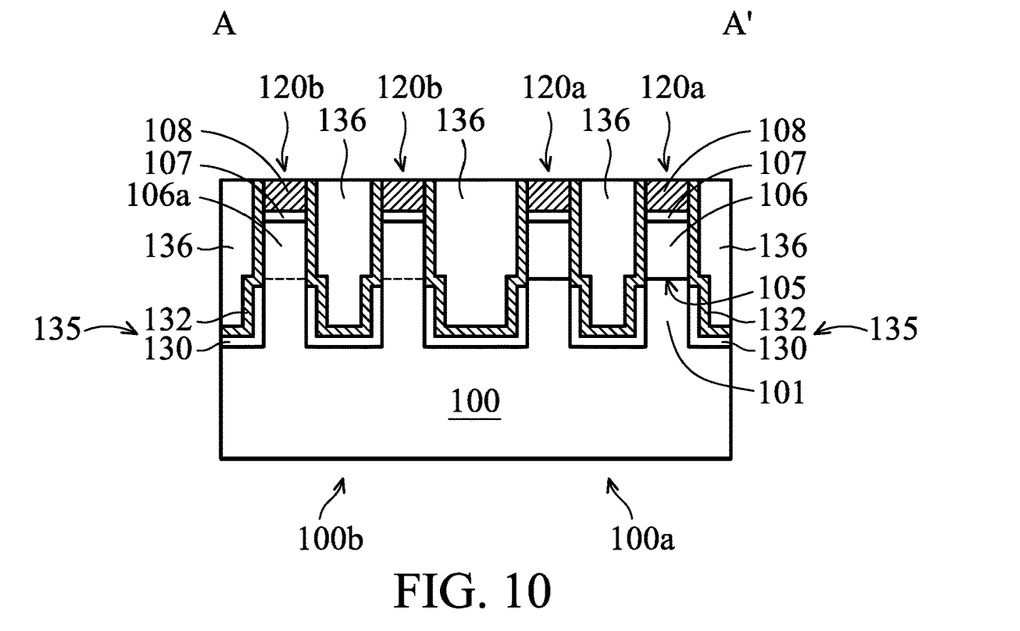

As shown in FIG. 10, the insulating layer 136 over the top surfaces of the first and fin structures 120a and 120b are removed by a planarization process, in accordance with some embodiments. The planarization process, such as CMP, is performed until the second insulating liner layer 132 above the top surface of the silicon nitride layer 108 is exposed. After performing the planarization process, the top surface the insulating layer 136 is substantially level with the second insulating liner layer 132 above the top surface of the silicon nitride layer 108.

Figure 11:
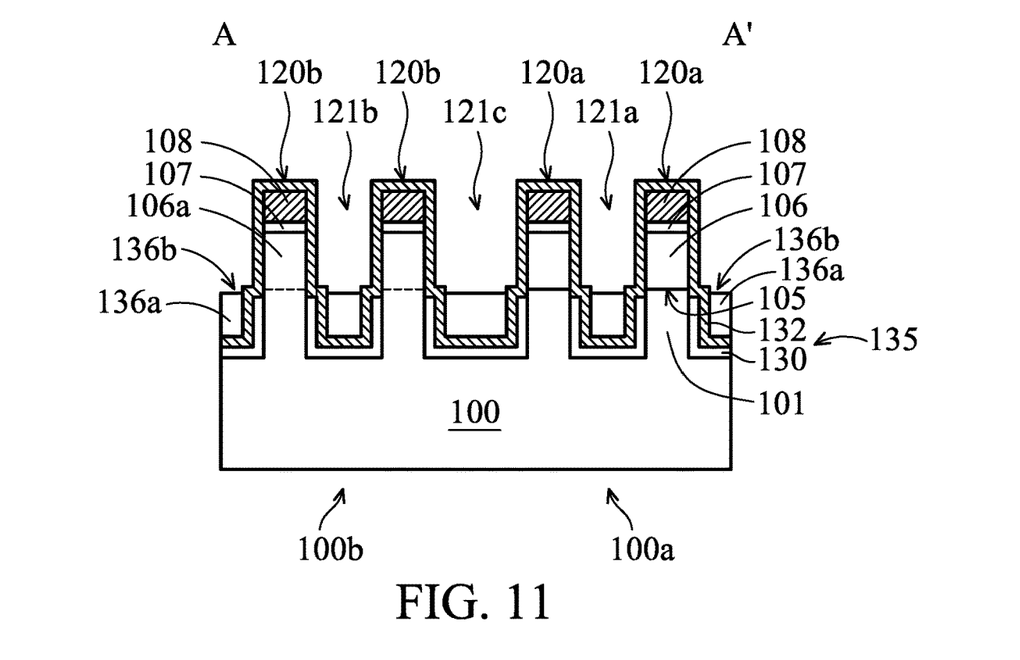

As shown in FIG. 11, a portion of the insulating layer 136 is removed to expose the second portions 105 of the first fin structure 120a in the first region 100a and upper portions of the second fin structures 120b in the second region 100b, in accordance with some embodiments. As a result, isolation features 136a are formed in the trenches 121a, 121b, and 121c and over the second insulating liner layer 132. Each isolation feature 136a has a top surface 136b below the interface 105 and the bottom (as indicated by a dashed line shown in FIG. 11) of the upper portion 106a (i.e., the channel region) of the second fin structure 102b. In some embodiments, the insulating layer 136 is removed by an etching process such as a dry etching process or a wet etching process, so as to form isolation features 136a.

Figure 12:
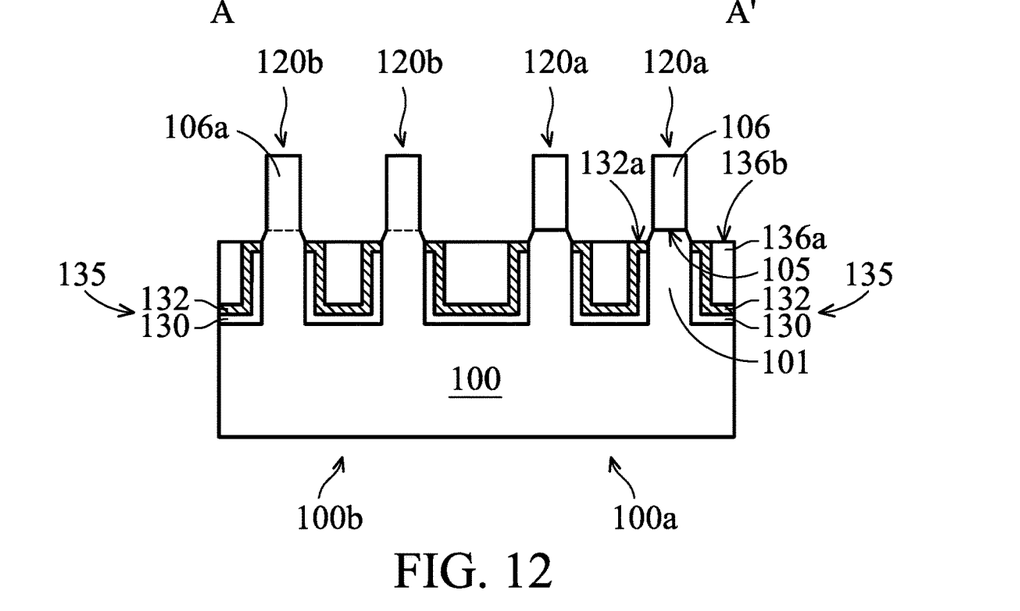

As shown in FIG. 12, the second insulating liner layer 132 is etched using each isolation feature 136a as an etch mask, in accordance with some embodiments. In some embodiments, the second insulating liner layer 132 is etched by a dry etching process or a wet etching process, so as to form isolation regions such as shallow trench isolation (STI) regions. The remaining second insulating liner layer 132 extends on the top surface 131 of the sidewall portion 129 (as indicated in FIG. 8) of the remaining first insulating liner layer 130. Moreover, the remaining second insulating liner layer 132 on the top surface 131 of the sidewall portion 129 of the remaining first insulating liner layer 130 has a top surface 132a below the interface 105 and below the bottom (as indicated by a dashed line shown in FIG. 12) of the upper portion 106a (i.e., the channel region) of the second fin structure 120b.

Each of the isolation regions includes an isolation feature 136a and a liner structure 135. The isolation features 136a cover the semiconductor substrate 100, the first portions 101 of the first fin structures 120a in the first region 100a, and lower portions of the second fin structures 120b in the second region 100b. Moreover, the second portions 106 of the first fin structures 120a and the upper portions 106a of the second fin structures 120b are exposed from the isolation regions.

Afterwards, the silicon nitride layer 108 and the underlying silicon oxide layer 107 in the first region 100a and the second region 100b are removed by an etching process, in accordance with some embodiments. In some embodiments, the etching process includes a wet etching process or a dry etching process.

Figure 13:
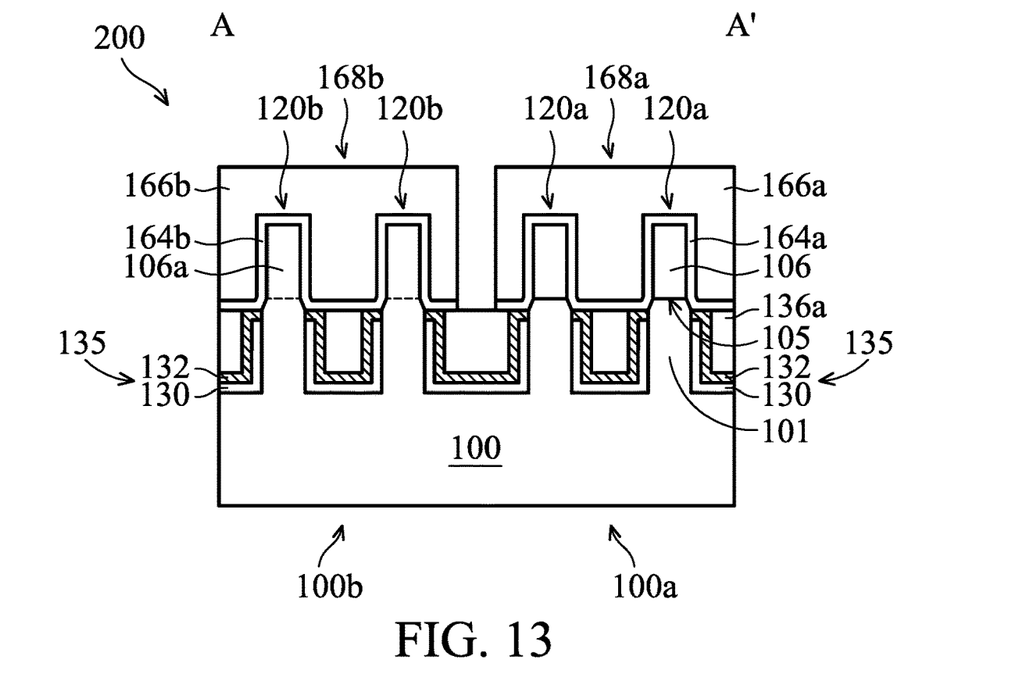

As shown in FIG. 13, a gate structure 168a is formed over the first fin structures 120a in the first region 100a and a gate structure 168b is formed over the second fin structures 120b in the second region 100b, in accordance with some embodiments. In some embodiments, the gate structure 168a may include a dummy gate dielectric layer 164a, a dummy gate electrode layer 166a over the dummy gate dielectric layer 164a, and gate spacers 158a (not shown in FIG. 13) formed on opposite sidewalls of the dummy gate electrode layer 166a. Similarly, the gate structure 168b may include a dummy gate dielectric layer 164b, a dummy gate electrode layer 166b over the dummy gate dielectric layer 164b, and gate spacers 158b (not shown in FIG. 13) formed on opposite sidewalls of the dummy gate electrode layer 166b.

As a result, the gate structure 168a is formed on a portion of the first fin structures 120a and the gate structure 168b is formed on a portion of the second fin structures 120b. The portion of each first fin structure 120a which is surrounded or wrapped by the gate structure 168a is a channel region of a P-type FinFET. The portion of each second fin structure 120b which is surrounded or wrapped by the gate structure 168b is a channel region of an N-type FinFET.

In some embodiments, the dummy gate dielectric layers 164a and 164b are formed of dielectric materials, such as silicon oxide, silicon nitride, silicon oxynitride, dielectric material with high dielectric constant (high-k), or combinations thereof. The dummy gate dielectric layers 164a and 164b may be formed by a deposition process, such as CVD, PVD, ALD, high density plasma CVD (HDPCVD), metal organic CVD (MOCVD), or plasma enhanced CVD (PECVD).

In some embodiments, the dummy gate electrode layers 166a and 166b are formed of conductive or non-conductive materials. In some embodiments, the dummy gate electrode layers 166a and 166b are formed of polysilicon. The dummy gate electrode layers 166a and 166b are formed by a deposition process, such as CVD, PVD, ALD, HDPCVD, MOCVD, or PECVD.

Afterwards, in some embodiments, a portion of each first fin structure 120a exposed from and adjacent to the gate structure 168a is removed to form a recess (not shown), and a source/drain (S/D) feature (not shown) is formed in the recess. A portion of each second fin structure 120b exposed from and adjacent to the gate structure 168b is removed to form a recess (not shown), and a source/drain (S/D) feature (not shown) is formed in the recess.

In some embodiments, the source/drain features include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

Afterwards, in some embodiments, an interlayer dielectric (ILD) layer (not shown) is formed on the gate structures 168a and 168b and the source/drain features. The ILD layer may be formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, LPCVD, HDPCVD, FCVD, or spin-on process.

Afterwards, in some embodiments, a gate-last process (sometimes referred to as a replacement gate process) is performed. In the gate-last process, the dummy gate electrode layers 166a and 166b and the dummy gate dielectric layers 164a and 164b are removed to form trenches. Afterwards, in some embodiments, a gate dielectric layer and gate electrode layer are formed in each trench. As a result, P-type FinFETs (PMOS devices) are formed in the first region 100a and N-type FinFETs (NMOS devices) are formed in the second region 100b.

In some embodiments, the gate dielectric layer includes silicon oxide, silicon nitride, or a high-k dielectric material including a metal oxide or a silicate of Hf, Al, Zr, La, Mg, Ba, Ti, Pb, or a combination thereof. The formation methods of gate dielectric layer may include CVD, ALD, PECVD, and the like.

In some embodiments, the gate electrode layer may be made of a metal-containing material such as TiN, TaN, TaC, Co, Ru, Al, combinations thereof, or multi-layers thereof, and may be formed by, e.g., electroplating, electroless plating, or other suitable method.

Embodiments of a semiconductor device structure and a method for forming the same are provided. First and second fin structures protrude from a semiconductor substrate and each of the first and second fin structures includes a channel region. A liner structure including a first insulating liner layer and a second insulating liner layer covering the first insulating liner layer is formed between isolation features (e.g., STI features) and the first and second fin structures, so as to protect the channel regions of the first and second fin structures from be damaged.

In some embodiments, the second liner layer includes silicon nitride or oxynitride, so as to prevent the first and second fin structures from being oxidized due to the subsequent high temperature process (e.g., STI steam anneal process).

Moreover, in some embodiments, the first insulating liner layer including silicon oxide blocks or reduces charges trapped in the second insulating liner layer (which includes silicon nitride or oxynitride) into the first and second fin structures, thereby reducing leakage in the semiconductor device.

In additional, in some embodiments, before the second insulating liner layer of the liner structure is formed, a portion of the first insulating liner layer covering the channel regions of the adjacent fin structures is removed. Therefore, the insulating layer for formation of the isolation feature can be easily filled into a gap/trench between the adjacent fin structures. Namely, the gap filling capability of the insulating layer is maintained or improved, thereby preventing voids from being formed in the STI structures.

In some embodiments, a method for forming a semiconductor device structure is provided. The method includes providing a first fin structure in a first region of a semiconductor substrate and having a first portion and a second portion over the first portion. The first portion is formed of a material that is the same as a material of the semiconductor substrate and different from a material of the second portion. The method also includes conformally forming a liner structure over the semiconductor substrate and the first fin structure. The liner structure includes a first insulating liner layer having a bottom portion covering the semiconductor substrate and a sidewall portion covering a sidewall of the first portion of the first fin structure. The liner structure also includes a second insulating liner layer over the bottom portion and the sidewall portion of the first insulating liner layer and extending on a top surface of the sidewall portion of the first insulating liner layer. The method also includes forming an isolation feature over the liner structure.

In some embodiments, a method for forming a semiconductor device structure is provided. The method includes forming a first fin structure in a first region of a semiconductor substrate and a second fin structure in a second region of the semiconductor substrate. The first fin structure includes a first portion and a second portion over the first portion. The first portion and the second fin structure are formed of a material that is the same as a material of the semiconductor substrate and different from a material of the second portion. The method also includes conformally forming a first insulating liner layer to cover the semiconductor substrate, the first fin structure, and the second fin structure and forming a masking layer over the first insulating liner layer and having a top surface that is below the interface between the first and second portions of the first fin structure. The method also includes etching the first insulating liner layer using the masking layer as an etch mask and removing the masking layer. The method also includes conformally forming a second insulating liner layer to cover a remaining first insulating liner layer, the second portion of the first fin structure, and an upper portion of the second fin structure after removing the masking layer. The method also includes forming an isolation feature over the second insulating liner layer and having a top surface that is below the interface and etching the second insulating liner layer using the isolation feature as an etch mask.

In some embodiments, a semiconductor device structure is provided. The semiconductor device structure includes a first fin structure protruding from a first region of a semiconductor substrate and having a first portion and a second portion over the first portion. The first portion is formed of a material that is the same as a material of the semiconductor substrate and different from a material of the second portion. The semiconductor device structure also includes a liner structure including a first insulating liner layer and a second insulating liner layer. The first insulating liner layer has a bottom portion covering the semiconductor substrate and a sidewall portion covering a sidewall of the first portion of the first fin structure. The second insulating liner layer is over the bottom portion and the sidewall portion of the first insulating liner layer and extends on a top surface of the sidewall portion of the first insulating liner layer. The semiconductor device structure also includes an isolation feature over the liner structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a first fin structure in a first region of a semiconductor substrate and having a first portion and a second portion over the first portion, wherein the first portion is formed of a material that is the same as a material of the semiconductor substrate and different from a material of the second portion;
    conformally forming a liner structure over the semiconductor substrate and the first fin structure, wherein the liner structure comprises:
    a first insulating liner layer having a bottom portion covering the semiconductor substrate and a sidewall portion covering a sidewall of the first portion of the first fin structure; and
    a second insulating liner layer over the bottom portion and the sidewall portion of the first insulating liner layer and extending on a top surface of the sidewall portion of the first insulating liner layer; and
    forming an isolation feature over the liner structure, wherein the second insulating liner layer on the top surface of the sidewall portion of the first insulating liner layer is exposed from the isolation feature and wherein the second insulating liner layer on the top surface of the sidewall portion of the first insulating liner layer has a top surface that is below an interface between the first and second portions of the first fin structure.

2. The method as claimed in claim 1, further comprising:
    providing a second fin structure in a second region of a semiconductor substrate and having an upper portion that serves as a channel region, wherein the upper portion of the second fin structure is formed of a material that is the same as the material of the first portion of the first fin structure and different from the material of the second portion of the first fin structure;
    conformally forming the liner structure over a sidewall of the second fin structure, wherein the channel region of the second fin structure is exposed from the liner structure; and
    forming the isolation feature over the liner structure over the second fin structure.

3. The method as claimed in claim 2, wherein the first region is a PMOS region and the second region is an NMOS region.

4. The method as claimed in claim 2, wherein the first portion of the first fin structure is formed of silicon and the second portion of the first fin structure is formed of silicon germanium (SiGe).

5. The method as claimed in claim 1, wherein the first insulating liner layer is formed of a material that is different from a material of the second insulating liner layer.

6. The method as claimed in claim 1, further comprising forming a gate structure over each of the first fin structure and the second fin structure, wherein the gate structure comprises:
    a gate dielectric layer;
    a gate electrode layer over the gate dielectric layer; and
    gate spacers on opposing sidewalls of the gate electrode layer.

7. The method as claimed in claim 1, wherein the first insulating liner layer is formed of silicon oxide the second insulating liner layer is formed of a nitride-containing or oxynitride-containing film.

8. A method for forming a semiconductor device structure, comprising:
    forming a first fin structure in a first region of a semiconductor substrate and a second fin structure in a second region of the semiconductor substrate, wherein the first fin structure comprises a first portion and a second portion over the first portion, and the first portion and the second fin structure are formed of a material that is the same as a material of the semiconductor substrate and different from a material of the second portion;
    conformally forming a first insulating liner layer to cover the semiconductor substrate, the first fin structure, and the second fin structure;
    forming a masking layer over the first insulating liner layer and having a top surface that is below the interface between the first and second portions of the first fin structure;
    etching the first insulating liner layer using the masking layer as an etch mask;
    removing the masking layer;
    conformally forming a second insulating liner layer to cover a remaining first insulating liner layer, the second portion of the first fin structure, and an upper portion of the second fin structure after removing the masking layer;
    forming an isolation feature over the second insulating liner layer and having a top surface that is below the interface; and etching the second insulating liner layer using the isolation feature as an etch mask.

9. The method as claimed in claim 8, wherein the remaining first insulating liner layer has a bottom portion covering the semiconductor substrate and a sidewall portion covering a sidewall of the first portion of the first fin structure.

10. The method as claimed in claim 9, wherein a remaining second insulating liner layer extends on a top surface of the sidewall portion of the remaining first insulating liner layer after etching the second insulating liner layer.

11. The method as claimed in claim 10, wherein the remaining second insulating liner layer on the top surface of the sidewall portion of the remaining first insulating liner layer has a top surface that is below the interface.

12. The method as claimed in claim 8, wherein the first region is a PMOS region and the second region is an NMOS region.

13. The method as claimed in claim 12, wherein the first portion of the first fin structure is formed of silicon and the second portion of the first fin structure is formed of silicon germanium (SiGe).

14. The method as claimed in claim 8, further comprising forming a gate structure over each of the first fin structure and the second fin structure, wherein the gate structure comprises:
   a gate dielectric layer;
   a gate electrode layer over the gate dielectric layer; and
   gate spacers on opposing sidewalls of the gate electrode layer.

15. The method as claimed in claim 8, wherein the first insulating liner layer is formed of a material that is different from a material of the second insulating liner layer.

16. A method for forming a semiconductor device structure, comprising:
   patterning a semiconductor substrate to form a first fin structure, a second fin structure adjacent to the first fin structure, and a trench between the first fin structure and the second fin structure, wherein the first fin structure has a channel region formed of a material that is different from a material of the first fin structure outside of the channel region;
   conformally forming a first insulating liner layer to cover sidewalls and a bottom of the trench, wherein a portion of the first insulating liner layer that covers the sidewalls of the trench has a top surface below a bottom of the channel region of the first fin structure;
   conformally forming a second insulating liner layer over the first insulating liner layer in the trench, such that the top surface of the portion of the first insulating liner layer is covered by the second insulating liner layer; and
   forming an isolation feature over the second insulating liner layer in the trench.

17. The method as claimed in claim 16, further comprising forming a gate structure over the semiconductor substrate and across the channel region of the first fin structure, wherein the gate structure comprises:
   a gate dielectric layer;
   a gate electrode layer over the gate dielectric layer; and
   gate spacers on opposing sidewalls of the gate electrode layer.

18. The method as claimed in claim 16, wherein the first insulating liner layer is formed of a material that is different from a material of the second insulating liner layer.

19. The method as claimed in claim 16, wherein the channel region of the first fin structure is formed of silicon germanium (SiGe) and the first fin structure outside of the channel region is formed of silicon.

20. The method as claimed in claim 16, wherein a portion of the second insulating liner layer that covers the top surface of the portion of the first insulating liner layer has a top surface that is below the bottom of the channel region of the first fin structure.

* * * * *